(12) United States Patent
Kappes

(10) Patent No.: US 6,388,523 B1
(45) Date of Patent: May 14, 2002

(54) DUAL-DRIVE COUPLING FOR OUTPUT AMPLIFIER STAGE

(75) Inventor: Michael S. Kappes, San Diego, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/688,628

(22) Filed: Oct. 16, 2000

(51) Int. Cl.$^7$ ................................................. H03F 3/18
(52) U.S. Cl. ........................................ 330/264; 330/267
(58) Field of Search ................................ 330/264, 267, 330/268, 253

(56) References Cited

U.S. PATENT DOCUMENTS

| | | | | |
|---|---|---|---|---|
| 4,656,435 A | * | 4/1987 | Czarniak et al. ............ | 330/253 |
| 5,485,123 A | * | 1/1996 | Kiehl ........................ | 330/264 |
| 5,642,078 A | * | 6/1997 | Navabi et al. .............. | 330/253 |
| 5,786,731 A | * | 7/1998 | Bales ......................... | 330/267 |
| 6,121,839 A | * | 9/2000 | Giacomini ................. | 330/264 |
| 6,163,216 A | * | 12/2000 | Murray et al. ............. | 330/255 |
| 6,166,603 A | * | 12/2000 | Smith ........................ | 330/267 |

* cited by examiner

*Primary Examiner*—Robert Pascal
*Assistant Examiner*—Khanh Van Nguyen
(74) *Attorney, Agent, or Firm*—Seed IP Law Group PLLC

(57) ABSTRACT

A dual-drive coupling for an output stage of class AB amplifier is disclosed. A class AB amplifier comprises a PMOS output device and an NMOS output device coupled together. Two signal sources are used; one to drive the PMOS output device and one to drive the NMOS output device. The signal source driving the PMOS output device has a transconductance that is three times greater than the signal source driving the NMOS output device because the PMOS device is about three times bigger than the NMOS output device. A floating resistor network, comprised of an NMOS transistor and a PMOS transistor is coupled between the coupling of the signal sources with the output devices. A replica device can be added between the PMOS output device and its corresponding signal source to replicate the drain voltage of the signal source for the NMOS output device.

18 Claims, 3 Drawing Sheets

DUAL-DRIVE COUPLING FOR OUTPUT AMPLIFIER STAGE

BACKGROUND OF THE INVENTION

1. Technical Field

The present invention relates, generally, to line driver amplifiers and, more particularly, to output stage coupling circuits for line driver amplifiers employing dual-drive couplings.

2. Background Art and Technical Problems

The output stage of an amplifier provides a low output resistance that enables output signal delivery to a load with minimal loss of gain. While it is the primary function of the output stage to generate the output signal with minimal loss, it is also desirable to efficiently produce the output signal with minimal total harmonic distortion (THD). This implies that the power dissipated by the output stage is minimized, while providing suitable device linearity.

The linearity of an amplifier employing negative feedback is determined by the open loop linearity of the amplifier and the cumulative loop gain around the distortion elements of the amplifier. Improving the open loop linearity generally improves amplifier performance, and may be achieved by increasing the device sizes of the output stage. In output stage amplifiers employing complimentary pull up and pull down output devices, the output stage device sizes are limited in part by the need to maintain consistent signal path gains to the output devices to both minimize distortion and maximize bandwidth. Presently known drive coupling topologies, however, do not adequately address the need for larger device sizes while also ensuring matched signal gains within the output device signal paths.

For example, the large gate capacitance of PMOS output devices and the resistive isolation of the biasing elements separating the NMOS gate node and the PMOS gate node results in output signal propagation delay. This has been addressed in some prior art systems by capacitively coupling the signal across the bias devices. This technique is a simple solution to circumventing delay incurred in the signal path through the bias devices. However, the capacitive feed-forward path is subject to a capacitive divider gain loss due to the large PMOS gate capacitance, which diminishes the usefulness of the capacitive coupling technique. For a broader discussion of capacitive coupling solutions, see: Babanezhad, J. N., "A 100 MHZ, 50 Ω-45 dB Distortion 3.3 V CMOS Line Driver for Ethernet and Fast Ethernet Networking Application", IEEE International Symposium on Solid-State Circuits, 1998, paper 20.2-1, the entire contents of which are hereby incorporated by this reference.

A dual-drive coupling mechanism is thus needed which overcomes the shortcomings of the prior art.

SUMMARY OF THE INVENTION

The present invention is directed to an output stage for an amplifier that satisfies these needs. An output stage having features of the present invention includes a PMOS output device coupled to an NMOS output device. Two signal sources are present, one coupled to the PMOS output device and one coupled to the NMOS output device. A floating resistor network is also present, coupled between the two signal sources.

An output stage according to the present invention may operate as follows: the input to the output stage is provided through one of two NMOS signal sources. A PMOS output device is coupled to an NMOS output device. Both output devices are a biased by a separate current source and a floating resistor network. The output at the junction of the PMOS and NMOS output device is the output of the output stage.

BRIEF DESCRIPTION OF THE DRAWING FIGURES

The present invention will hereinafter be described in conjunction with the appended drawing figures, wherein like numerals denote like elements, and:

DETAILED DESCRIPTION OF PREFERRED EXEMPLARY EMBODIMENTS

Output stage amplifiers, for example of the type used in line driving circuits for telecommunications applications, often employ a P-type pull up output device and an N-type pull down output device to control the output voltage to the resistive load. In Class A amplifier operation, the output devices remain heavily biased in the on position and are modulated by the input signal. Although this avoids having to turn the output devices on and off and, hence, avoids the transients associated with the turning on and off of the devices, Class A operation consumes significant power inasmuch as the output devices remain in the on condition even when they are not being modulated.

Class B operation, on the other hand, conserves power by turning on the output devices only when needed to conduct a signal to the output load. However, turning the output devices on and off creates undesirable transients.

Class AB amplifier operation exploits the benefits of both Class A and Class B operation, while minimizing the undesirable aspects of both. In a classical Class AB implementation, the output devices are maintained in their quiescent state, or their "barely on" state, and are alternately pulled up and pulled down (modulated) to apply the input signal to the output load. By being barely on in their quiescent mode, the output devices minimize power consumption, yet also eliminate the non-linearity and transient effects of switching on and off.

Figure 1:
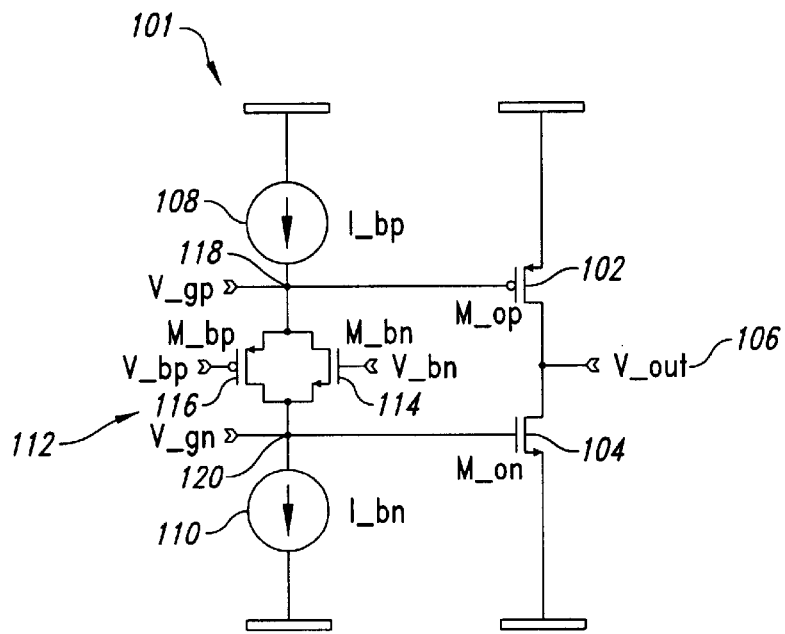
FIG. 1 is an electrical schematic circuit diagram of a classical implementation of a Class AB biasing stage of the prior art.

Referring now to FIG. 1, a classical implementation of a Class AB biasing stage circuit 101 suitably comprises a "floating resistor" network 112 including transistors 114 and 116, the respective gates of which are modulated by respective current sources 108 and 110. Floating resistors 114 and 116 cooperate with current sources 108 and 110 to alternately modulate the gates of output devices 102 and 104, to thereby translate the input signal to the output load 106. For a discussion of operational amplifier cells, see, for example, J. H. Huijsing, R Hogervorst, and K. L. De Langen, "Low-Power Low-Voltage VLSI Operational Amplifier Cells", IEEE Transactions on Circuits and Systems, November 1995, pages. 853–863, the contents of which are hereby incorporated by reference.

An input drive signal may be applied to the floating resistor network by one or both of current sources 108, 110. By precisely controlling the voltage at respective floating resistor gates 114 and 116, output device 102 is maintained in its quiescent current state while output device 104 is modulated, and output device 104 is maintained in its quiescent current state while output device 102 is modulated. For a more complete discussion of quiescent current control circuits in Class AB amplifiers, see co-pending patent application, Ser. No. 09/566,745, entitled "Apparatus and Methods for Improved Control of Quiescent State of Output Transistors in a Class AB Amplifier," filed on May 9, 2000 by Michael S. Kappes, and also assigned to Conexant Systems, Inc.

Figure 2:
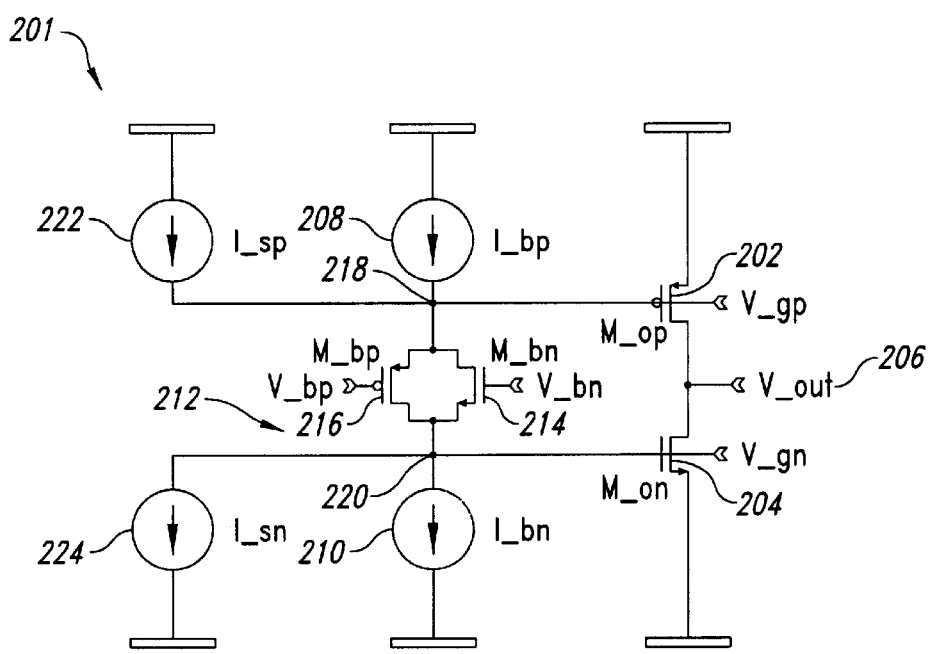
FIG. 2 is a schematic circuit diagram of a complimentary input drive, Class A biasing stage.

Referring now to FIG. 2, a complimentary input drive circuit 201 suitably comprises a floating resistor network 212, respective biasing current sources 208, 210 for biasing output devices 202, 204, and signal modulation sources 222 and 224. Complimentary input drive circuit 201 implies classical Class A type amplifier operation, in that input source 208 is typically employed to bias output device 202 to the quiescent current condition, whereas input source 210 is typically configured to bias output device 204 in the on condition. Signal input information can be applied by one or both of input devices 222, 224. While the circuit of FIG. 2 permits broad flexibility in applying an input signal to the output devices, the circuit is considered to be inefficient in terms of power consumption, as well as consuming a lot of "real estate" on a die as a result of the multiple current input sources.

Figure 3:
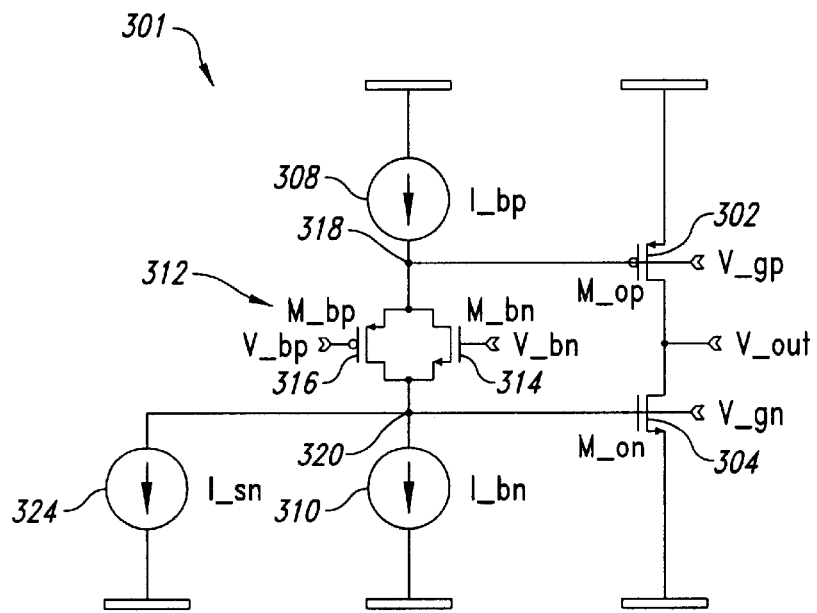
FIG. 3 is a schematic circuit diagram of a single input, Class A biasing stage.

Referring now to FIG. 3, a single input drive circuit 301 suitably comprises a floating resistor network 312 including respective transistors 314 and 316, bias sources 308 and 310, and a single input signal drive 324. Input signal drive 324 is more efficient in terms of power and real estate than circuit 201 shown in FIG. 2, and also implies Class A operation inasmuch as bias devices 308, 310 are typically employed to bias respective output devices 302, 304, while the output devices are typically modulated by signal source 324. Although circuit 301 has been implemented widely in prior art devices, it is undesirable in several respects. For example, although input source 324 can effectively modulate both output devices 302 and 304, the signal transfer function from input device 324 to output device 302 is different from the signal transfer function between input device 324 and output device 304. In particular, the respective gates of output devices 302 and 304 see different capacitances when being modulated by single input 324.

Figure 4:
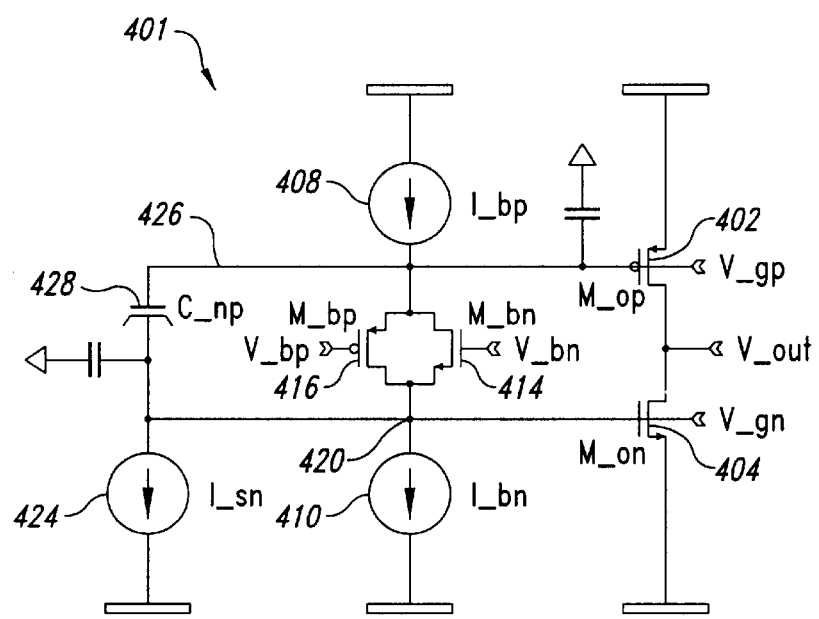
FIG. 4 is a schematic circuit representation of the single input drive shown in FIG. 3, with an added capacitive coupling element of the prior art.

One popular prior art technique for alleviating the different signal transfer functions associated with circuit 301 (FIG. 3) is shown in the capacitively coupled drive circuit 401 of FIG. 4.

Referring now to FIG. 4, capacitively coupled drive 401 suitably includes respective floating resistors 414 and 416, respective bias sources 408 and 410 configured to bias respective output devices 402 and 404, and a single input drive 424. As briefly discussed above in connection with FIG. 3, signal source 324 is certainly capable of modulating output device 304 directly while also modulating output device 302 indirectly through the impedance associated with floating resistor network 312. It is generally understood, however, that it is more difficult for signal source 324 to pull up the P-device 302 than it is for signal source 324 to pull down the N-device 304. To accommodate this difference in signal path transfer functions, the capacitively coupled circuit 401 employs an AC coupling across the floating resistor network to bypass the impedance associated with the floating resistors.

More particularly, an AC coupling 426 is suitably employed between signal source 424 and output device 402. One technique for implementing this AC coupling involves providing a capacitor 428 in series between signal source 424 and output device 402. This arrangement effectively allows the signal path from signal source 424 to output device 402 to bypass the impedance associated with the floating resistor network. At high frequencies, capacitor 428 effectively creates a short circuit, such that the gates of both output devices see the same voltage. The arrangement shown in FIG. 4 is disadvantageous, however, inasmuch as a fairly large capacitance is needed to accommodate the large gate capacitance associated with output device 402. Hence, the implementation of FIG. 4 is considered to be an expensive solution.

Figure 5:
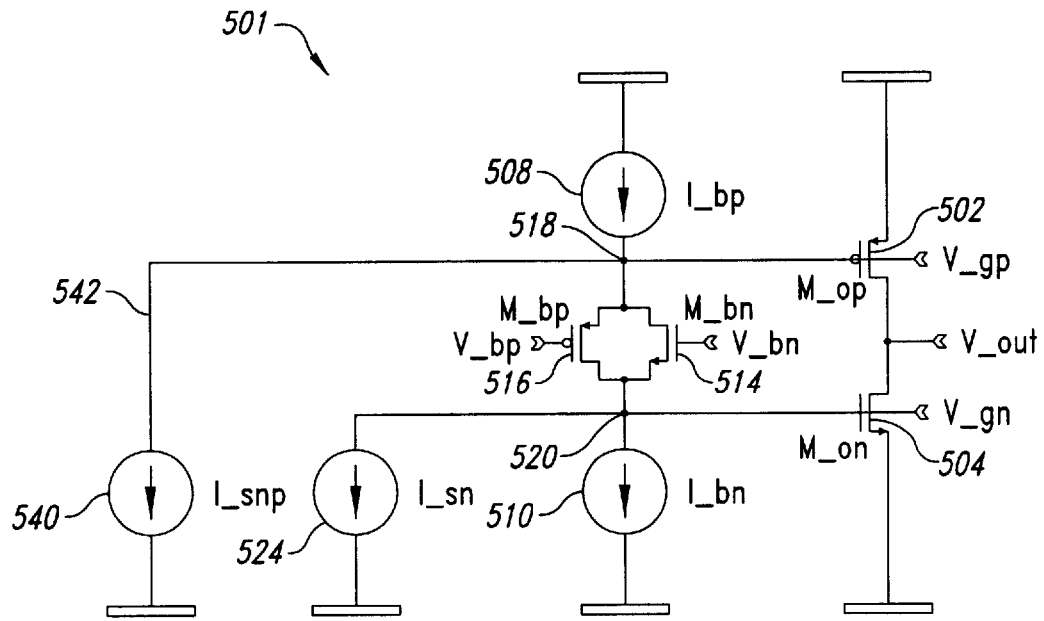
FIG. 5 is a schematic circuit diagram of a dual-drive coupled bias circuit in accordance with the present invention.

Referring now to FIG. 5, a preferred embodiment of the dual-drive implementation of the present invention is shown. In particular, a dual-drive coupling circuit 501 suitably comprises respective floating resistors 514, 516, respective biasing sources 508, 510, and respective signal sources 524, 540.

Signal source 524 suitably comprises an NMOS device configured to modulate the gate of output device 504, which is also suitably an NMOS device. In a preferred embodiment of the dual-drive implementation of the present invention, an NMOS pull down device 540 is suitably configured to modulate the gate of output device 502.

Figure 6:
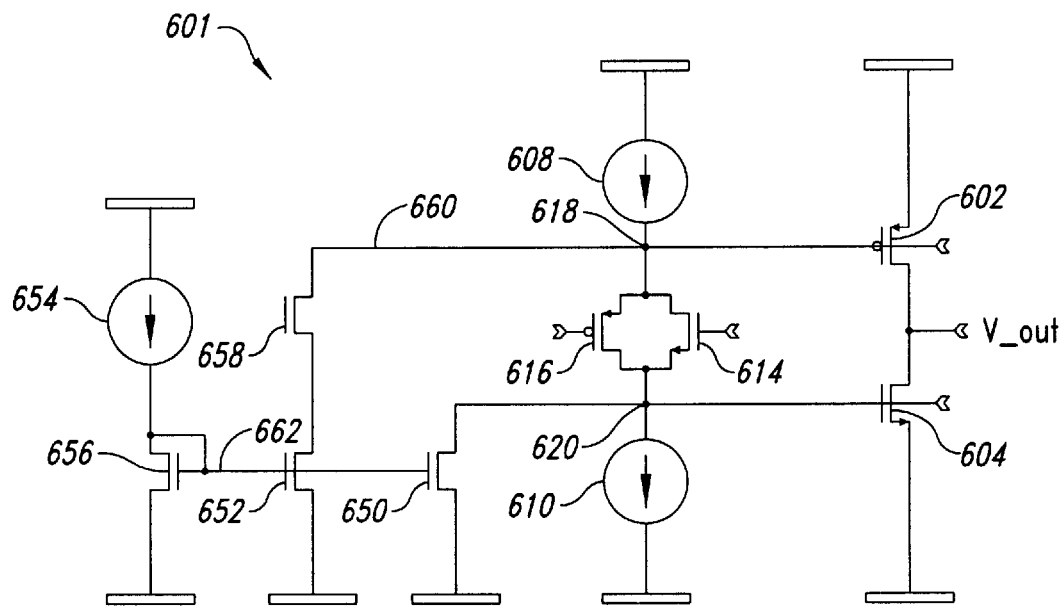
FIG. 6 is a schematic circuit diagram of the dual-drive circuit shown in FIG. 5, illustrating a replica device added to the signal path, and illustrating the current sources as transistors.

Referring now to FIGS. 5 and 6, the dual-drive implementation of the present invention exploits the fact that an NMOS pull down device is typically faster than a PMOS pull up device. However, in a typical silicon process, the transconductance (output current to input voltage transfer function) of a PMOS device is about ⅓ that of an NMOS device. Since it is desirable to have equal pull up and pull down drive capability for open loop linearity and general wide-swing performance, the PMOS devices are about 3 times bigger than the NMOS devices. Since it is desirable to have equal gain in the signal path from input device 540 to output device 502 as well as from input device 524 to output device 504, and further since the capacitance of the PMOS output device 502 (602 in FIG. 6) is about 3 times that of the NMOS device 504 (604 in FIG. 6), the dual-drive implementation of the present invention employs a pull down NMOS device 540 (652 in FIG. 6) characterized by a transconductance which is 3 times that of signal source 524 (650 in FIG. 6).

With continued reference to FIG. 6, the signal sources having reference numbers 652 and 650 are generally analogous to the signal sources denoted as 540 and 524, respectively, in FIG. 5. The current source 654 and the diode-connected transistor 656 act as a current mirror to supply current to the signal sources 652 and 650. It should be understood that the diode-connected transistor 656 may be suitably replaced by diodes of various different forms. To further enhance the operation of the dual-drive circuit shown in FIG. 5, the dual-drive coupling circuit 601 of FIG. 6 further employs a replica device 658 in series between the signal source 652 and the output device 602. In a preferred embodiment, the transistor 658 suitably replicates the transistor 616 so that the drain voltage of the signal source 650 is essentially replicated (via transistor 658) for the signal source 652.

The foregoing description is of preferred embodiments of the subject invention. It will be appreciated that the foregoing description is not intended to be limiting; rather, the preferred embodiments set forth herein merely set forth exemplary applications of the subject invention. It will be appreciated that various changes, deletions, and additions may be made to the components and steps discussed herein, without departing from the spirit and scope of the invention as set forth in the appended claims.

I claim:

1. An output stage for an amplifier comprising:
   a PMOS output device coupled to a first voltage source;
   an NMOS output device coupled to said PMOS output device and coupled to a second voltage source;
   a first NMOS signal source coupled to said NMOS output device at a first node and to the second voltage source;
   a second NMOS signal source coupled to said PMOS output device at a second node and to the second voltage source;
   a first current source coupled to the first node;
   a second current source coupled to tile second node; and
   a floating resistor network coupled to the first and second nodes and having first and second control terminals coupled to the first and second current sources respectively.

2. The output stage of claim 1, wherein said floating resistor network comprises:
   a PMOS transistor; and
   an NMOS transistor coupled to said PMOS transistor.

3. The output stage of claim 2, wherein each of said PMOS transistor and said NMOS transistor comprise a gate, a source and a drain; wherein
   said source of said NMOS transistor is coupled to said drain of said PMOS transistor, and
   said source of said PMOS transistor is coupled to said drain of said NMOS transistor.

4. The output stage of claim 1, wherein the ratio of the size of said PMOS output device to the size of said NMOS output device is in the range of 3.

5. The output stage of claim 4, wherein the ratio of the transconductance of the second signal source to the transconductance of the first signal source is in the range of 3.

6. An output stage for an amplifier comprising:
   a PMOS output device coupled to a first voltage source,
   a NMOS output device coupled to said PMOS output device and to a second voltage source;
   a floating resistor network;
   a first signal source coupled to said NMOS output device; and
   a second signal source coupled to said PMOS output device,
   wherein,
      said floating resistor network is coupled between said first signal source and said second signal source, and further wherein
      said first signal source comprises a first NMOS device coupled to the second voltage source, and said second signal source comprises a second NMOS device coupled to tie second voltage source.

7. An output stage for an amplifier comprising:
   a PMOS output device coupled to a first voltage source,
   an NMOS output device coupled to said PMOS output device coupled to a second voltage source;
   a floating resistor network comprising first and second transistors;
   a first NMOS signal source coupled to said NMOS output device and to lie second voltage source;
   a second NMOS signal source coupled to said PMOS output device; and
   a replica device comprising a third transistor configured to replicate the first transistor and coupled between said second NMOS signal source and said PMOS output device,
   wherein,
      said floating resistor network is coupled between said first NMOS signal source and said NMOS second signal source.

8. The output stage of claim 7, wherein said replica device is configured to provide a drain voltage approximately equal to the drain voltage of said first signal source.

9. The output stage of claim 7, wherein said replica device comprises a transistor.

10. An output stage for an amplifier comprising:
    a PMOS output device coupled to a first voltage source;
    an NMOS output device coupled to said PMOS output device and to a second voltage source,
    a floating resistor network;
    a first NMOS signal source coupled to said NMOS output device coupled to the second voltage source;
    a second NMOS signal source coupled to said PMOS output device coupled to the second voltage source,
    a current source; and
    a diode coupled to said current source, wherein
       said diode is coupled to both said first NMOS signal source and said second NMOS signal source, and further wherein,
       said floating resistor network is coupled between said first NMOS signal source and said second NMOS signal source .

11. A method of outputting a signal, said method comprising:
    providing an NMOS output device coupled to a first voltage source;
    providing a first NMOS signal source to drive said NMOS output device aid coupled to the first voltage source;
    providing a PMOS output device coupled to a second voltage source;
    providing a second NMOS signal source to drive said PMOS output device ad coupled to the first voltage source;
    coupling said NMOS output device to said PMOS output device at a junction;
    biasing said NMOS output device with a first current source;
    biasing said PMOS output device with a second current source;
    biasing both said PMOS output device and said NMOS output device with a floating resistor network;
    inputting a signal to be outpatted through said first NMOS signal source and said second NMOS signal source; and
    obtaining the output signal from said junction of said PMOS output device and said NMOS output and device.

12. The method of claim 11 wherein the ratio of size of said PMOS output device and said NMOS output device is in the range of 3.

13. An output device for an amplifier prepared by a process comprising:

providing an NMOS output device;

providing a first NMOS signal source to drive said NMOS output device;

providing a PMOS output device;

providing a second NMOS signal source to drive said PMOS output device;

coupling said NMOS output device to said PMOS output device at a junction;

providing a first current source to bias said NMOS output device;

providing a second current source to bias said PMOS output device;

providing a first signal source for input signals;

providing a second signal source for input signals;

providing a floating resistor network coupled between said first signal source and said second signal source;

coupling said first signal source to said NMOS output device; and coupling said second signal source to said PMOS output device.

14. The output stage of claim 13 wherein said floating resistor network comprises:

a PMOS transistor; and an NMOS transistor coupled to said PMOS transistor.

15. The output stage of claim 13, wherein the process further comprises:

providing a current source, and a diode coupled to said current source, wherein said transistor is coupled to both said first signal source and said second signal source.

16. The output stage of claim 13 wherein the process further comprises:

providing a replica device between said second signal source and said PMOS output device.

17. The output stage of claim 13 wherein the ratio of the size of said PMOS output device to the size of said NMOS output device is in the range of 3.

18. The output stage of claim 17, wherein the ratio of the transconductance of the second signal source to the transconductance of the first signal source is in the range of 3.

* * * * *

UNITED STATES PATENT AND TRADEMARK OFFICE
CERTIFICATE OF CORRECTION

PATENT NO.    : 6,388,523 B1
DATED         : May 14, 2002
INVENTOR(S)   : Michael S. Kappes It is certified that error appears in the above-identified patent and that said Letters Patent is hereby corrected as shown below:

Column 5,
Line 24, "a second current source coupled to tile second" should read -- a second current source coupled to the second --.
Line 49, "a NMOS output device" should read -- an NMOS output device --.
Line 63, "coupled to tie second voltage" should read -- coupled to the second voltage --.

Column 6,
Line 8, "device and to lie second voltage" should read -- device and to the second voltage --.
Line 17, "and said NMOS second" should read -- and said second --.
Line 46, "output device aid coupled to the first" should read -- output device and coupled to the first --.
Line 50, "PMOS output device ad coupled to the first" should read -- PMOS output device and coupled to the first --.
Line 60, "inputting a signal to be outpatted through" should read -- inputting a signal to be outputted through --.
Line 61, "and said NMOS output and" should read -- and said NMOS output --.

Signed and Sealed this

Fourth Day of February, 2003

JAMES E. ROGAN
*Director of the United States Patent and Trademark Office*